(12) United States Patent
Kim et al.

(10) Patent No.: US 9,746,780 B2
(45) Date of Patent: Aug. 29, 2017

(54) MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

(71) Applicant: SAMSUNG DISPLAY CO., LTD., Yongin, Gyeonggi-Do (KR)

(72) Inventors: Hyun-Seok Kim, Hwaseong-si (KR); Sang-Hyun Yun, Suwon-si (KR); Hi-Kuk Lee, Yongin-si (KR); Jae-Hyuk Chang, Seongnam-si (KR); Sang-Hyun Lee, Suwon-si (KR); Jung-In Park, Seoul (KR); Jung-Chul Heo, Seoul (KR); Kab-Jong Seo, Seoul (KR); Ki-Beom Lee, Seoul (KR); Jun-Ho Sim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/745,366

(22) Filed: Jun. 19, 2015

(65) Prior Publication Data

US 2016/0116847 A1  Apr. 28, 2016

(30) Foreign Application Priority Data

Oct. 24, 2014  (KR) .................. 10-2014-0145417

(51) Int. Cl.
  *G03B 27/54*  (2006.01)
  *G03F 7/20*  (2006.01)

(52) U.S. Cl.
  CPC ...... *G03F 7/70291* (2013.01); *G03F 7/70358* (2013.01); *G03F 7/70508* (2013.01)

(58) Field of Classification Search
  CPC ..... G03F 7/20; G03F 7/70058; G03F 7/70283
  USPC .................... 355/52, 53, 67; 359/291, 292
  See application file for complete search history.

(56) References Cited

U.S. PATENT DOCUMENTS

2004/0229130 A1 * 11/2004 Baba-Ali .................. G03F 1/14
                                                          430/5
2009/0135399 A1 *  5/2009 Hirukawa ........... G03F 7/70283
                                                          355/71

FOREIGN PATENT DOCUMENTS

| JP | 2005-109510 A | 4/2005 |
| JP | 2010-14796 A | 1/2010 |
| JP | 2011-49296 A | 3/2011 |
| KR | 10-2009-0095770 A | 9/2009 |
| KR | 10-2012-0030438 A | 3/2012 |

* cited by examiner

*Primary Examiner* — Hung Henry Nguyen
(74) *Attorney, Agent, or Firm* — Lewis Roca Rothgerber Christie LLP

(57) ABSTRACT

A maskless exposure device includes an exposure head including a digital micro-mirror device and an exposure source, the digital micro-mirror device being configured to reflect a source beam outputted from the exposure source to a substrate and a system controller configured to control the digital micro-mirror device by using a graphic data system file. The graphic data system file includes data regarding patterns to be formed on the substrate. A pattern extending in a direction parallel to a scan direction of the exposure head includes a first pattern portion having a first width that is greater than a target width and a second pattern portion alternately disposed with the first pattern portion and having a second width that is less than the target width.

18 Claims, 12 Drawing Sheets

MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

CROSS-REFERENCE TO RELATED APPLICATION

This application claims priority to and the benefit under 35 U.S.C. §119 of Korean Patent Application No. 10-2014-0145417, filed on Oct. 24, 2014 in the Korean Intellectual Property Office KIPO, the content of which are hereby incorporated by reference in its entirety.

BACKGROUND

1. Field

Exemplary embodiments of the present invention relate to a maskless exposure device, a maskless exposure method, and a display substrate manufactured by using the maskless exposure device and the maskless exposure method.

2. Description of the Related Art

Generally, to form a metal pattern of thin film transistors ("TFTs"), which are switching elements of a display substrate, and signal lines, a metal layer and a photoresist layer are sequentially formed and a mask corresponding to the metal pattern is disposed on the photoresist layer.

Then, a light is irradiated to an upper surface of the mask so that the photoresist layer is exposed and developed. Thus, the photoresist pattern corresponding to the mask is formed. The metal layer is etched to form the metal pattern. When the metal layer is etched, the photoresist pattern functions as an etch stopping layer.

The display substrate includes a plurality of metal patterns, each having a shape different from each other, so that a plurality of masks corresponding to the number of metal patterns is required. In addition, when the shape of the metal pattern is changed, the shape of the mask has to be correspondingly changed such that a new mask is fabricated. As fabricating cost of the mask is relatively high, manufacturing cost of the display substrate may increase.

A maskless exposure device providing a plurality of beams to a substrate without a mask has been used. In the maskless exposure device, the beams are independently turned on or off so that the beams are selectively provided to the substrate. Thus, a desired photoresist pattern may be formed on the substrate.

However, each beam has different optical characteristics, such as a size of the beam, a position of the beam, and an intensity of the beam. Thus, a critical dimension of a wiring may be different from that of adjacent wirings. Accordingly, faults, such as a stain in the display panel, may occur.

SUMMARY

Exemplary embodiments of the present invention provide a maskless exposure device capable of reducing defects in a display panel.

Exemplary embodiments of the present invention further provide a maskless exposure method capable of reducing defects in a display panel.

Exemplary embodiments of the present invention further provide a display substrate manufactured by using the maskless exposure device and the maskless exposure method.

In an exemplary embodiment of a maskless exposure device according to the present invention, the maskless exposure device includes an exposure head including a digital micro-mirror device and an exposure source, the digital micro-mirror device being configured to reflect a source beam output from the exposure source to a substrate, a system controller configured to control the digital micro-mirror device by using a graphic data system file. The graphic data system file includes data regarding patterns to be formed on the substrate. A pattern extending in a direction parallel to a scan direction of the exposure head includes a first pattern portion having a first width that is greater than a target width and a second pattern portion alternately arranged with the first pattern portion and having a second width that is less than the target width.

In an exemplary embodiment, a difference between the first width and the target width may be less than about 0.25 μm. A difference between the second width and the target width may be less than about 0.25 μm.

In an exemplary embodiment, the pattern extending in the direction parallel to the scan direction of the exposure head may have a structure in which the first pattern portion and the second pattern portion are sequentially arranged. The structure may be repeated.

In an exemplary embodiment, the pattern extending in the direction parallel to the scan direction of the exposure head may have a structure in which the first pattern portion, another first pattern portion, and the second pattern portion are sequentially arranged. The structure may be repeated.

In an exemplary embodiment, the pattern extending in the direction parallel to the scan direction of the exposure head may have a structure that the first pattern portion, the second pattern portion, and another second pattern portion are sequentially arranged. The structure may be repeated.

In an exemplary embodiment, the first width of the first pattern portion may be greater than about 5 μm and less than about 10 μm.

In an exemplary embodiment, the second width of the second pattern portion may be greater than about 5 μm and less than about 10 μm.

In an exemplary embodiment, the pattern extending in the direction parallel to the scan direction of the exposure head may be a pattern configured to form a gate line.

In an exemplary embodiment, the pattern extending in the direction parallel to the scan direction of the exposure head may be a pattern configured to form a data line.

In an exemplary embodiment of method of maskless exposure according to the present invention, the method includes generating digital micro-mirror device on/off data from a graphic data system file corresponding to a pattern to be formed on a substrate, and exposing the substrate in response to the digital micro-mirror device on/off data. The graphic data system file includes data regarding patterns to be formed on the substrate. A pattern extending in a direction parallel to a scan direction of the exposure head includes a first pattern portion having a first width that is greater than a target width and second pattern portion alternately arranged with the first pattern portion and having a second width that is less than the target width.

In an exemplary embodiment, a difference between the first width and the target width may be less than about 0.25 μm. A difference between the second width and the target width may be less than about 0.25 μm.

In an exemplary embodiment, the pattern extending in the direction parallel to the scan direction of the exposure head may have a structure in which the first pattern portion and the second pattern portion are sequentially arranged. The structure may be repeated.

In an exemplary embodiment, the pattern extending in the direction parallel to the scan direction of the exposure head may have a structure in which the first pattern portion, another first pattern portion, and the second pattern portion are sequentially arranged. The structure may be repeated.

In an exemplary embodiment, the pattern extending in the direction parallel to the scan direction of the exposure head may have a structure in which the first pattern portion, the second pattern portion, and another second pattern portion are sequentially arranged. The structure may be repeated.

In an exemplary embodiment, the first width of the first pattern portion may be more than 5 μm and less than 10 μm.

In an exemplary embodiment, the second width of the second pattern portion may be more than 5 μm and less than 10 μm.

In an exemplary embodiment, the pattern extending in the direction parallel with the scan direction of the exposure head may be a pattern configured to form a gate line.

In an exemplary embodiment, the pattern extending in the direction parallel with the scan direction of the exposure head may be a pattern configured to form a data line.

In an exemplary embodiment of a display substrate according to the present invention, the display substrate includes a plurality of pixels extending in a column direction and in a row direction, a plurality of gate lines electrically connected to the pixels, and extending in the column direction and a plurality of data lines electrically connected to the pixels, and extending in the row direction. A shape of sides of the data lines is non-uniform in a plan view. A shape of sides of the gate lines is non-uniform in a plan view.

In an exemplary embodiment of a display substrate according to the present invention, the display substrate includes a plurality of pixels extending in a column direction and in a row direction, a plurality of gate lines electrically connected to the pixels, and extending in the column direction and a plurality of data lines electrically connected to the pixels, and extending in the row direction.

According to the present exemplary embodiment, the pattern extending in a direction parallel to a scan direction of the exposure head has a structure in which the first pattern portion and the second pattern portion are alternately arranged. Thus, the pattern may have a sawtooth shape. Therefore, an effect of different characteristics of beams may be offset so that defects, such as a stain in a display panel, may be reduced.

In addition, sides of a gate line or a data line of a display panel may be non-uniform in a plan view. Therefore, an effect resulting from different characteristics of various beams may be offset, and a difference of critical dimensions of adjacent lines may be reduced. Accordingly, defects, such as stain of display panel, may be decreased.

BRIEF DESCRIPTION OF THE DRAWINGS

The above and other features and characteristics of the present invention will become more apparent by describing, in detail, exemplary embodiments thereof with reference to the accompanying drawings, in which.

DETAILED DESCRIPTION

Figure 1:
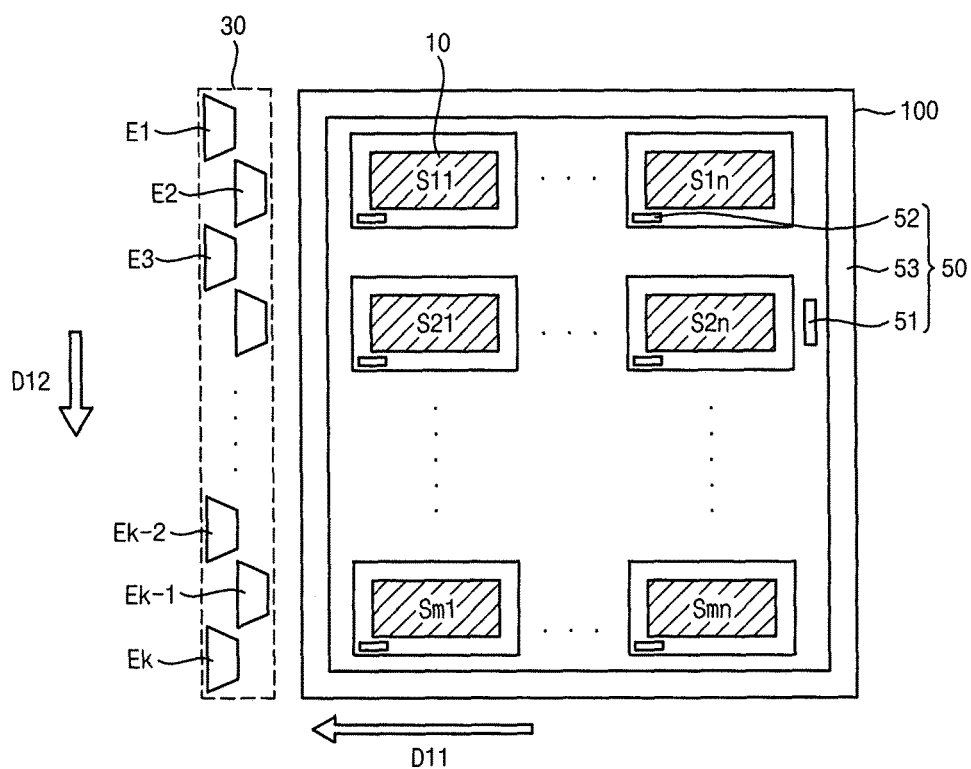
FIG. 1 is a plan view illustrating a maskless exposure device according to an exemplary embodiment of the present invention.

Hereinafter, exemplary embodiments of the present invention will be explained in detail with reference to the accompanying drawings.

It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention". Expression, such as "at least one of," when preceding a list of elements, modify the entire list of elements and do not modify the individual elements of the list. Also, the term "exemplary" is intended to refer to an example or illustration.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

The terminology used herein is for the purpose of describing particular example embodiments only and is not intended to be limiting of example embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a plan view illustrating a maskless exposure device according to an exemplary embodiment of the present invention.

Referring to FIG. 1, a substrate 100 is a main substrate for forming a display panel. The substrate 100 includes a plurality of first areas 10 and a plurality of second areas 50 excluding (e.g., outside of or other than) the first areas 10. A plurality of display panels S11, . . . , Smn are arranged in a matrix with one display panel formed in each of the first areas 10. In this embodiment, 'm' and 'n' are natural numbers. The second areas 50 include glass ID areas 51, where an identification number of the substrate 100 is formed, and cell ID areas 52, where an identification number of the display panels is formed. In addition, the second areas 50 include an edge exposure area 53 that is an edge portion of the substrate 100.

The substrate 100 is transferred (e.g., moved) below an exposure part 30 (e.g., an exposure device) along a first direction D11 to be exposed. The substrate 100 is transferred below the exposure part 30 by a stage disposed below the substrate 100.

To expose the substrate 100, a step exposing method or a scan exposing method may be employed. In the step exposing method, a substrate is transferred and stopped repeatedly during exposing. In the scan exposing method, a substrate is continuously transferred during exposing. For example, an island pattern may be formed through the step exposing method, and a strip pattern may be formed through the scan exposing method.

The exposure part 30 includes a plurality of exposure heads E1, E2, E3, . . . , Ek-2, Ek-1, and Ek. The exposure heads E1, E2, E3, . . . , Ek-2, Ek-1, and Ek are arranged along a second direction D12 that cross (e.g., is substantially perpendicular to) the first direction D11. In this embodiment, 'k' is a natural number.

For example, the exposure heads E1, E2, E3, . . . , Ek-2, Ek-1, and Ek are disposed in (e.g., arranged in) two rows. The exposure heads in a first row and the exposure heads in a second row may be alternately disposed along the second direction D12. The exposure heads E1, E2, E3, . . . , Ek-2, Ek-1, and Ek may be variously arranged along the second direction D12 in any suitable manner.

The exposure part 30 exposes the substrate 100 being transferred in the first direction D11 such that an exposure pattern is formed in a direction opposite to the first direction D11.

The exposure heads E1, E2, E3, . . . , Ek-2, Ek-1, and Ek include a digital micro-mirror device ("DMD"). The DMD may irradiate an exposure beam in response to a data signal (e.g., an on/off data signal). A source beam from a digital mirror of a cell of the DMD is reflected to generate the exposure beam, and the exposure beam exits from (e.g., is output by) the exposure heads E1, E2, E3, . . . , Ek-2, Ek-1, and Ek.

Figure 2:
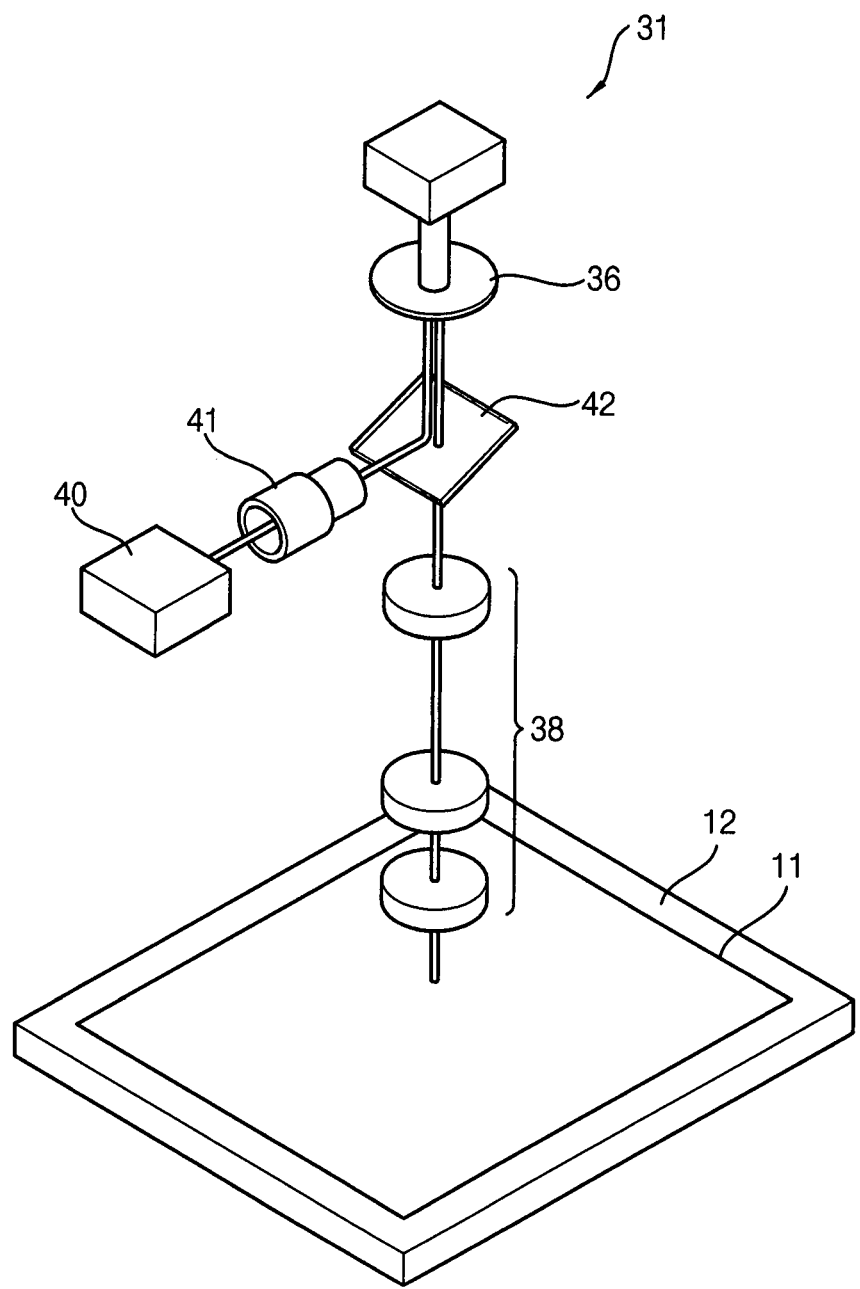
FIG. 2 is a perspective view illustrating an exposure head according to the exemplary embodiment of the exposure device shown in FIG. 1.

FIG. 2 is a perspective view illustrating an exposure head according to the exemplary embodiment of the exposure device shown in FIG. 1.

Referring to FIGS. 1 and 2, the exposure head 31 includes the DMD 36. The DMD 36 receives the source beam from an exposure source 40. The source beam may be an ultraviolet (UV) ray for exposing a photoresist film 11. The photoresist film 11 is formed on a target substrate 12 corresponding to an object to be exposed. When a pattern is to be formed on a substrate, the photoresist film 11 is used to form a mask of the pattern. The photoresist film 11 may be formed by coating a photosensitive resin, such as an epoxy resin, on a surface of a glass substrate. The DMD 36 selectively reflects the source beam onto the target substrate 12 for each pixel based on image data.

The exposure head 31 includes a projection optical device 38. The projection optical device 38 includes a plurality of lenses and converts light selectively reflected by the DMD 36 into the exposure beam.

Figure 3:
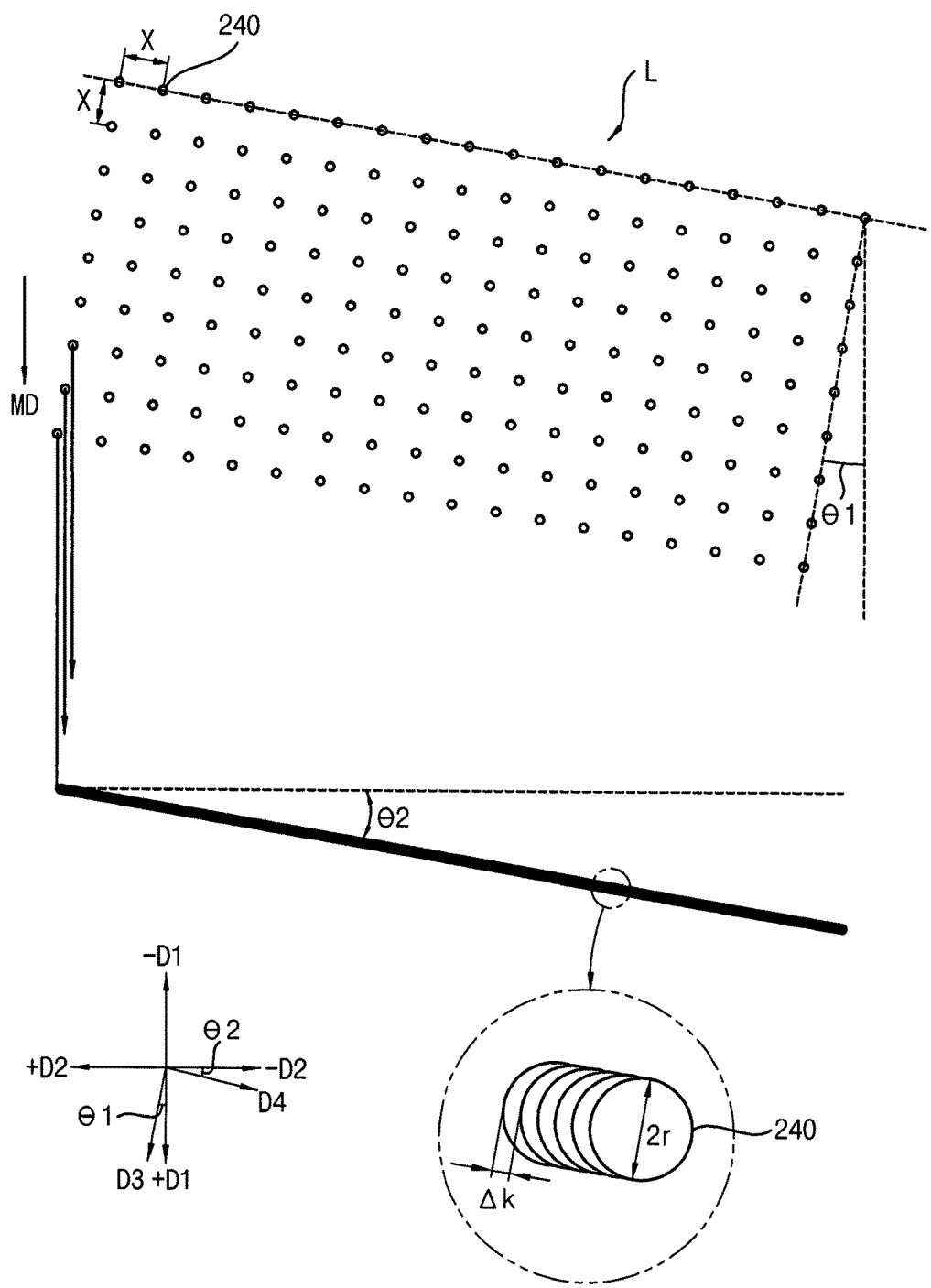
FIG. 3 is a plan view illustrating an exposure step using the exposure head shown in FIG. 1.

FIG. 3 is a plan view illustrating an exposure step using the exposure head shown in FIG. 1.

Referring to FIG. 3, a maskless exposure device according to an exemplary embodiment of the present invention is fixed to be inclined by a first angle $\theta_1$ with respect to a side of the substrate extending in a first direction +D1 and −D1. When a second direction +D2 and −D2 defines a direction which crosses (e.g., is substantially perpendicular to) the first direction +D1 and −D1, the inclined direction of the maskless exposure device is between the first direction +D1 and −D1 and the second direction +D2 and −D2. Hereinafter, the first direction +D1 and −D1 is divided into a positive first direction +D1 and a negative first direction −D1, and the second direction +D2 and −D2 is divided into a positive second direction +D2 and a negative second direction −D2.

The inclined direction of the maskless exposure device may be a third direction D3 between the positive first direction +D1 and the positive second direction +D2. The first angle $\theta_1$ is defined as an acute angle rotated clockwise with respect to a reference line extending in the first direction +D1 and −D1. For example, the first angle $\theta_1$ may be between about 0.1° and about 0.5°.

The maskless exposure device inclined in the third direction D3 provides spot beams 240 onto the substrate along a scanning direction MD. The scanning direction MD is the same or substantially the same as the first positive direction +D1. When the first angle $\theta_1$ of the maskless exposure device is about 0° and the maskless exposure device exposes the substrate along the positive first direction +D1, regions between the spot beams 240 of the substrate are not exposed. Therefore, in order to entirely expose a region (e.g., a predetermined region), the maskless exposure device inclined with respect to the substrate by the first angle $\theta_1$ provides the light onto the substrate.

When the digital micro-mirrors receive the data (e.g., the activation data or the on data) and the spot beams 240 are irradiated onto the substrate which is stopped, the spot beams 240 are spaced apart from each other in the third direction D3 by a distance (e.g., a predetermined distance) "x." In addition, the spot beams 240 are spaced apart from each other in a direction which crosses (e.g., is substantially perpendicular to) the third direction D3 (e.g., a direction D4) by the distance (e.g., the predetermined distance) "x."

In order to selectively expose the region (e.g., the predetermined region) of the substrate, for example, a pattern-formed region L, the spot beams 240 are selectively irradiated in the pattern-formed region L. In the present example embodiment, the pattern-formed region L is defined as a region extending along the fourth direction D4 inclined in a clockwise direction with respect to another side of the substrate by a second angle $\theta_2$. The pattern-formed region L is designed having a rectangular shape extending in the fourth direction D4 by an operator. When the maskless exposure device entirely exposes the pattern-formed region L, the spot beams 240 having a circular shape having a diameter "2r" overlap with each other by a distance (e.g., a predetermined distance) "Δk" in the pattern-formed region L so that the pattern-formed region L of the substrate is entirely exposed.

Figure 4:
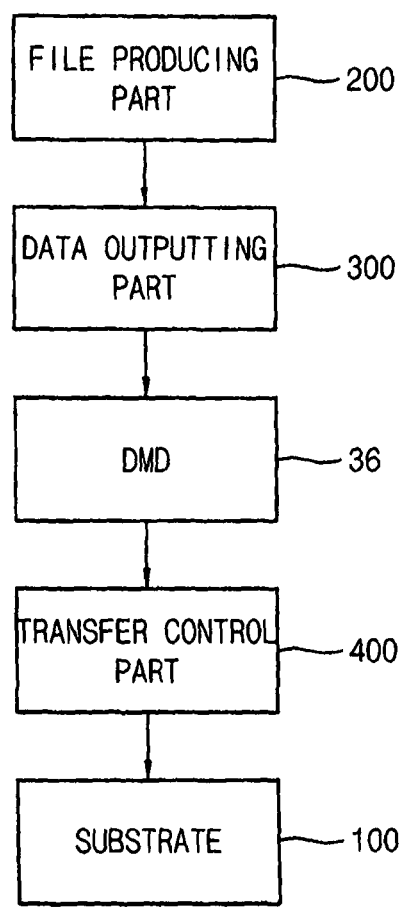
FIG. 4 is a block diagram of a maskless exposure method according to an exemplary embodiment of the maskless exposure device shown in FIG. 1.

FIG. 4 is a block diagram of a maskless exposure method according to an exemplary embodiment of the maskless exposure device shown in FIG. 1.

Referring to FIGS. 1 and 4, the maskless exposure method 500 may utilize a system controller including a file producer 200, a data outputter 300, and a transfer controller 400.

The file producer 200 produces a graphic data system ("GDS") file. The GDS file is an inverse of a multilayered computer-aided design ("CAD") file. For example, the GDS file includes data for each layer, such as a gate pattern, an active pattern, source drain patterns, and so on.

The data outputter 300 generates the digital micro-mirror device on/off data from the graphic data system GDS file.

The data outputter 300 outputs the digital micro-mirror device on/off data to the digital micro-mirror device 36.

The transfer controller 400 outputs a transfer signal which transfers the stage. The transfer controller 400 also controls on/off timing of the exposure beam in response to the DMD on/off data supplied from the data outputter 300 in addition to transferring the stage.

The maskless exposure device according to an exemplary embodiment of the present invention may be used to manufacture a display substrate by using a manufacturing method including producing a graphic data system file respectively corresponding to each of a plurality of patterns to be formed on a substrate, generating digital micro-mirror device on/off data from the graphic data system files to control on/off timing of the digital micro-mirror device, and exposing the substrate according to the digital micro-mirror device on/off data.

The DMD on/off data is generated from the GDS file in the data outputter 300. An on/off file for generating the DMD on/off data may be configured by '1's and '0's in a binary file (e.g., the DMD on/off data may be digital data). In this embodiment, when the on/off data is '1', the DMD is turned on so that light is delivered to a substrate. Alternatively, when the on/off data is '0', the DMD is turned off so that the light is not delivered to the substrate.

The DMD selectively reflects the light based on the DMD on/off data to expose the substrate 100 according to the data of the patterns stored in the GDS file. Therefore, a substrate having the patterns stored in the GDS file may be formed.

Figure 5:
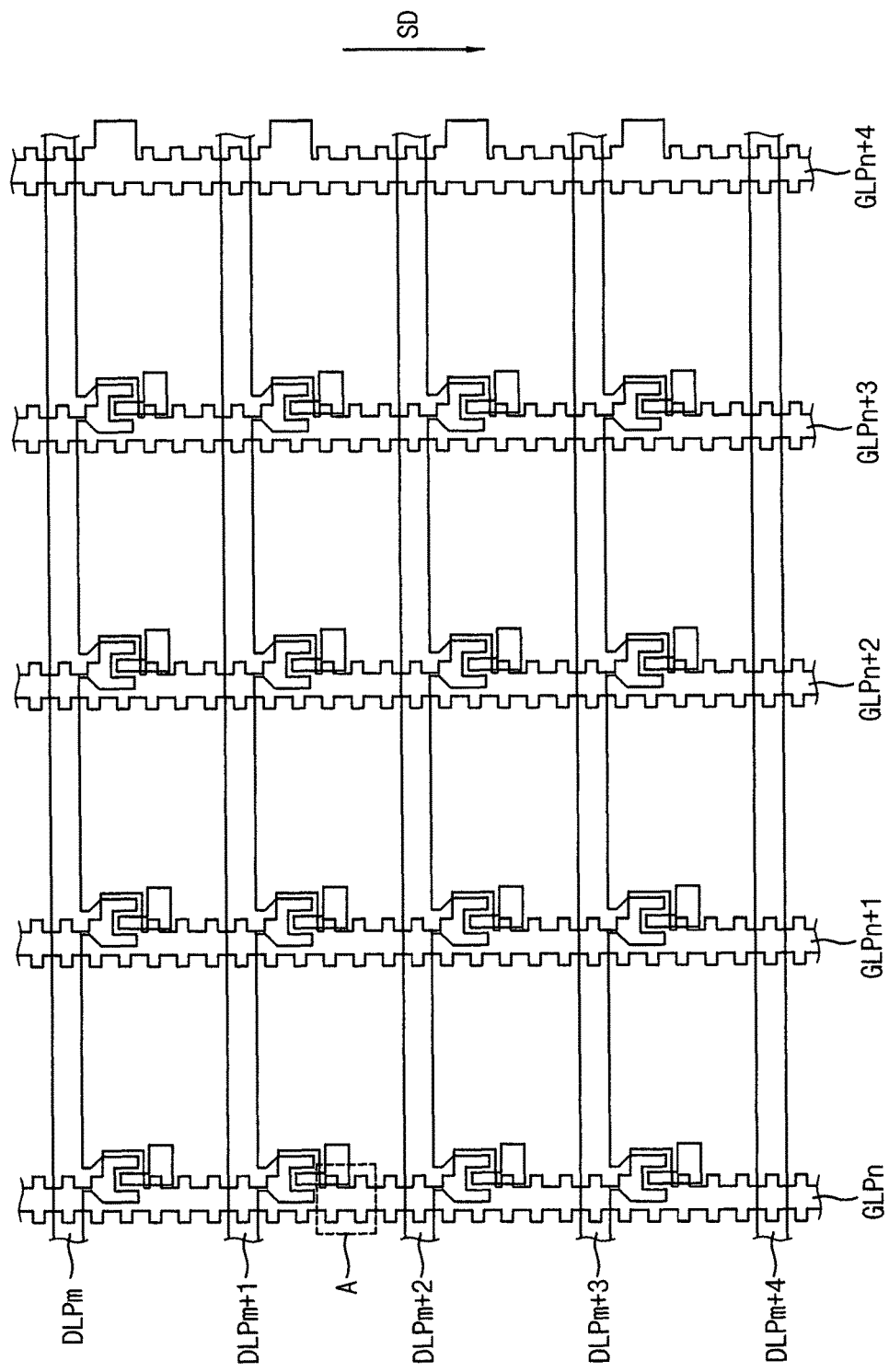
FIG. 5 is a plan view illustrating a gate pattern and a data pattern of a graphic data system file used for a digital micro-mirror device of an exposure head according to an exemplary embodiment of the present invention.
Figure 6:
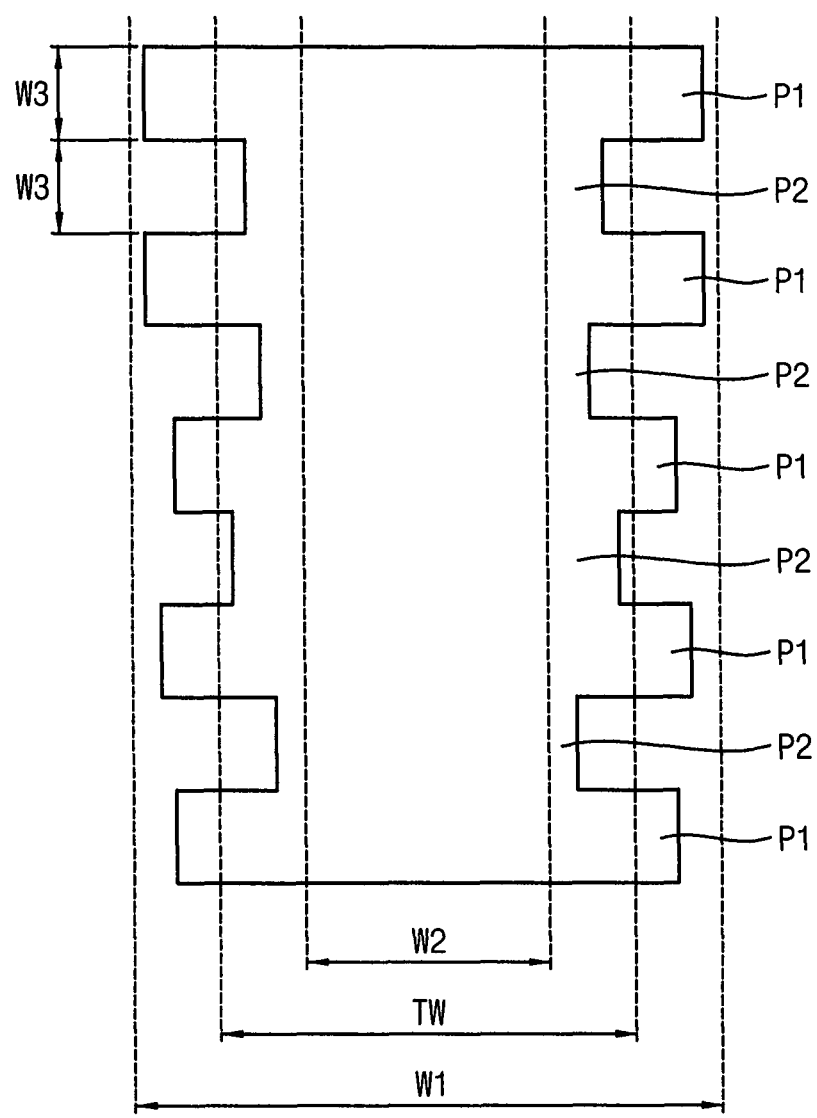
FIG. 6 is a magnified plan view of the 'A' portion of FIG. 5.

FIG. 5 is a plan view illustrating a gate pattern and a data pattern of a graphic data system file used for a digital micro-mirror device of an exposure head according to an exemplary embodiment of the present invention. FIG. 6 is a plan view magnifying the 'A' portion of FIG. 5.

Referring to FIGS. 5 and 6, a gate pattern and a data pattern of a graphic data system file used for a digital micro-mirror device of an exposure head according to an exemplary embodiment of the present invention is illustrated.

The GDS file includes data of a plurality of pixels arranged in a column direction and a row direction. A pattern of the GDS file extending in a direction parallel or substantially parallel with a scan direction of the exposure head may have a sawtooth shape. In the present exemplary embodiment, the pattern of the GDS file extending in the direction parallel with the scan direction of the exposure head may be a gate line pattern GLPn.

In the present exemplary embodiment, a gate line pattern GLPn extends in a direction parallel with the scan direction SD, and thus, the gate line pattern GLPn has a sawtooth shape. A data line pattern DLPm extends in a direction which crosses (e.g., is perpendicular to) the scan direction SD. Thus, the data line pattern DLPm may not have a sawtooth shape but may have a straight-line shape.

However, the present invention is not limited thereto. Alternatively, when the data line pattern DLPm extends in the direction parallel to the scan direction SD, the data line pattern DLPm may have a sawtooth shape. In addition, all patterns extending in the direction parallel to the scan direction of the exposure head may have a sawtooth shape.

The gate line pattern GLPn may include a first pattern portion P1 and a second pattern portion P2. The first pattern portion P1 may be alternately disposed with the second pattern portion P2.

The first pattern portion P1 may have a first width W1 in a column direction (e.g., in the direction which crosses the scan direction SD). The first width W1 may be greater than a target width TW in the column direction. For example, a difference between the first width W1 and the target width TW may be less than about 0.25 μm. The first pattern portion P1 may have a third width W3 in a row direction (e.g., in the scan direction SD). Each of the first pattern portions P1 may have a third width W3 in the row direction. For example, the third width W3 may be more than about 5 μm and less than about 10 μm. The first pattern portion P1 may have a symmetrical shape with respect to a center of the gate line pattern GLPn.

The second pattern portion P2 may have a second width W2 in the column direction. The second width W2 may be less than the target width TW in the column direction. For example, a difference between the second width W2 and the target width TW may be less than about 0.25 µm. The second pattern portion P2 may have the third width W3 in the row direction. Each of the second pattern portions P2 may have the third width W3 in the row direction. For example, the third width W3 may be more than about 5 µm and less than about 10 µm. The second pattern portion P2 may have a symmetrical shape with respect to the center of the gate line pattern GLPn.

In the present exemplary embodiment, the gate line pattern GLPn has a repetitive structure in which the first pattern portions P1 and the second pattern portions P2 are sequentially disposed. However, the present invention is not limited thereto. Alternatively, the gate line pattern GLPn may have a structure in which the first pattern portions P1 and the second pattern portions P2 are randomly disposed.

An exposure head of an exposure device outputs a plurality of beams. In addition, different beams may form a plurality of gate lines and a plurality of data lines of a display panel. Thus, a critical dimension of a line may be different from that of adjacent lines. Accordingly, defects, such as stain of display panel, may occur.

However, the pattern of the graphic data system file extending in the direction parallel to the scan direction of the exposure head according to the present exemplary embodiment has a structure in which the first pattern portions and the second pattern portions are alternately disposed. Thus, the pattern may have a sawtooth shape. Therefore, effects resulting from different characteristics of various beams may be reduced such that defects, such as stain of display panel, may be reduced.

Figure 7:
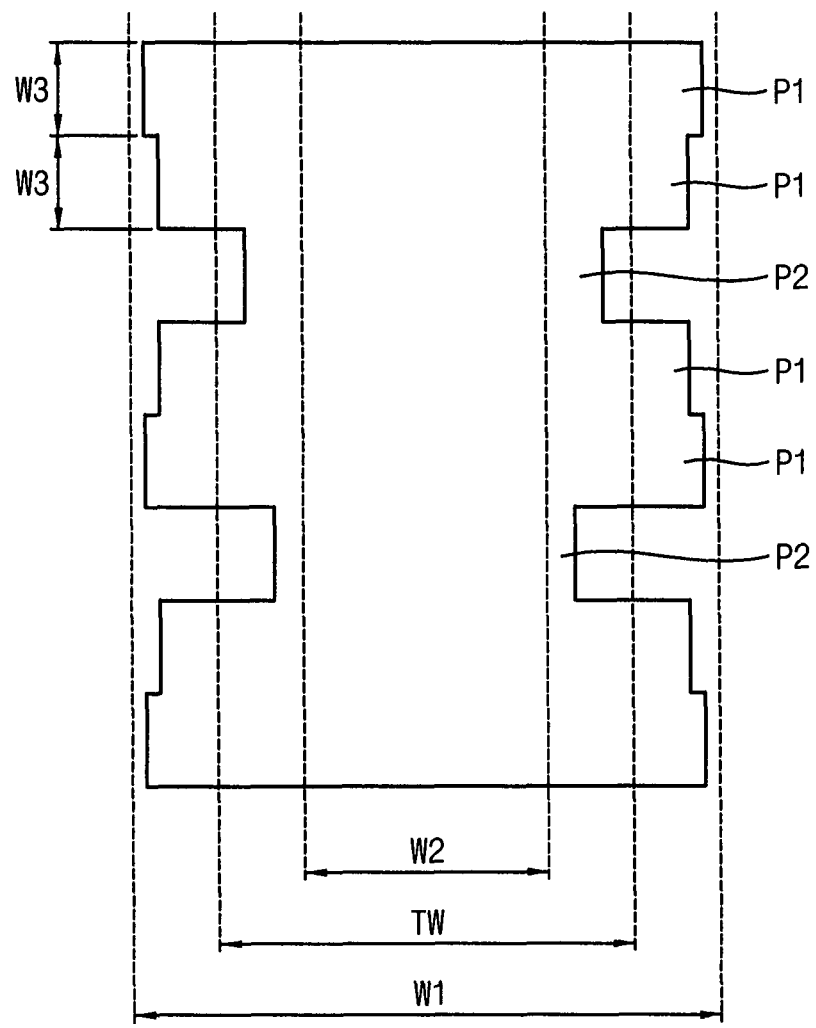
FIG. 7 is a magnified plan view of a gate pattern of a graphic data system file used for a digital micro-mirror device of an exposure head according to an exemplary embodiment of the present invention.

FIG. 7 is a magnified plan view of a gate pattern of a graphic data system file used for a digital micro-mirror device of an exposure head according to an exemplary embodiment of the present invention.

Referring to FIG. 7, the gate line pattern GLPn may include a first pattern portion P1 and a second pattern portion P2. The first pattern portion P1 may be alternately disposed with the second pattern portion P2.

The first pattern portion P1 may have a first width W1 in a column direction. The first width W1 may be greater than a target width TW in the column direction. For example, a difference between the first width W1 and the target width TW may be less than about 0.25 µm. The first pattern portion P1 may have a third width W3 in a row direction. Each of the first pattern portions P1 may have the third width W3 in the row direction. For example, the third width W3 may be more than about 5 µm and less than about 10 µm. The first pattern portion P1 may have a symmetrical shape with respect to a center of the gate line pattern GLPn.

The second pattern portion P2 may have a second width W2 in the column direction. The second width W2 may be less than the target width TW in the column direction. For example, a difference between the second width W2 and the target width TW may be less than about 0.25 µm. The second pattern portion P2 may have the third width W3 in the row direction. Each of the second pattern portions P2 may have the third width W3 in the row direction. For example, the third width W3 may be more than about 5 µm and less than about 10 µm. The second pattern portion P2 may have a symmetrical shape with respect to the center of the gate line pattern GLPn.

In the present exemplary embodiment, the gate line pattern GLPn has a repeated structure in which the first pattern portion P1, another first pattern portion P1 (e.g., another first pattern portion P1 having a width that may be different than that of the first pattern portion P1 but is greater than the target width TW), and the second pattern portion P2 are sequentially disposed. However, the present invention is not limited thereto. Alternatively, the gate line pattern GLPn has a structure in which the first pattern portion P1 and the second pattern portion P2 are randomly disposed.

An exposure head of an exposure device outputs a plurality of beams. In addition, different beams may form a plurality of gate lines and a plurality of data lines of a display panel. Thus, a critical dimension of one line may be different from that of adjacent lines. Accordingly, defects, such as stain of display panel, may occur.

However, the pattern of the graphic data system file extending in the direction parallel to the scan direction of the exposure head according to the present exemplary embodiment has a structure in which the first pattern portions and the second pattern portions are alternately disposed. Thus, the pattern may have a sawtooth shape. Therefore, an effect resulting from different characteristics of various beams may be reduced such that defects, such as stain of display panel, may be reduced.

Figure 8:
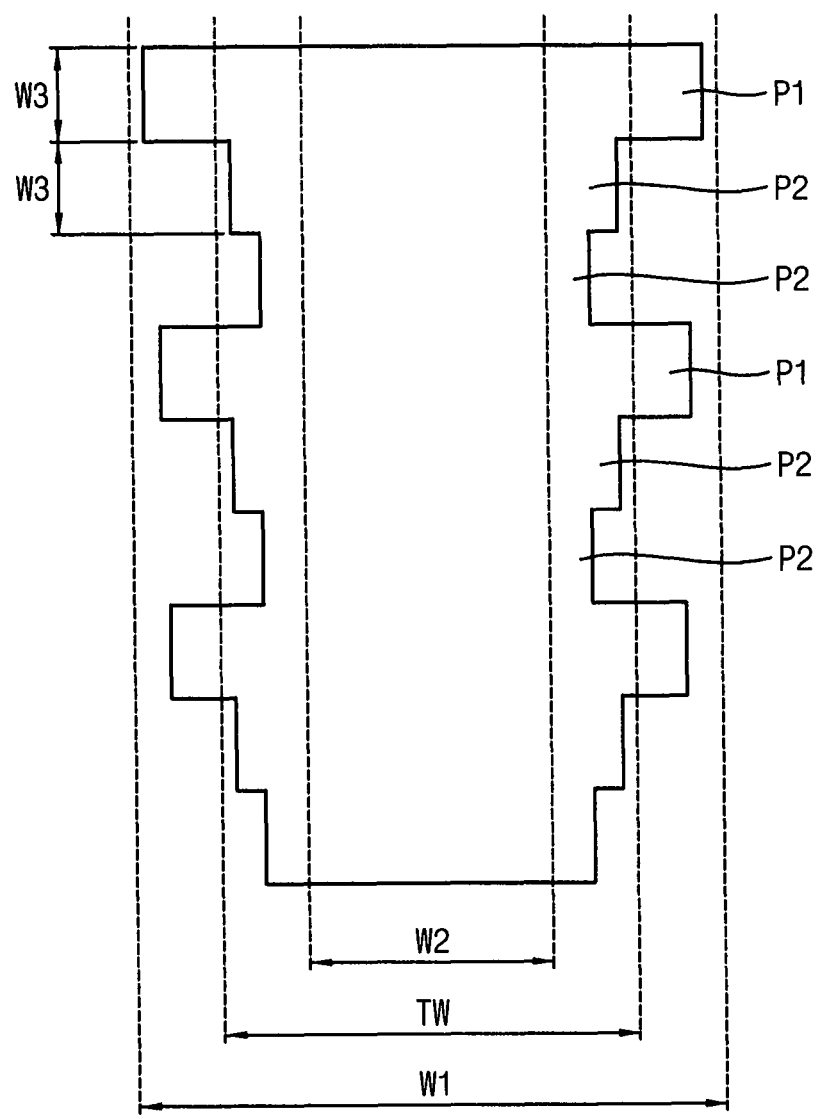
FIG. 8 is a magnified plan view of a gate pattern of a graphic data system file used for a digital micro-mirror device of an exposure head according to an exemplary embodiment of the present invention.

FIG. 8 is a magnified plan view of a gate pattern of a graphic data system file used for a digital micro-mirror device of an exposure head according to an exemplary embodiment of the present invention.

Referring to FIG. 8, the gate line pattern GLPn may include a first pattern portion P1 and a second pattern portion P2. The first pattern portion P1 may be alternately disposed with the second pattern portion P2.

The first pattern portion P1 may have a first width W1 in a column direction. The first width W1 may be greater than a target width TW in the column direction. For example, a difference between the first width W1 and the target width TW may be less than about 0.25 µm. The first pattern portion P1 may have a third width W3 in a row direction. Each of the first pattern portions P1 may have the third width W3 in the row direction. For example, the third width W3 may be more than about 5 µm and less than about 10 µm. The first pattern portion P1 may have a symmetrical shape with respect to a center of the gate line pattern GLPn.

The second pattern portion P2 may have a second width W2 in the column direction. The second width W2 may be less than the target width TW in the column direction. For example, a difference between the second width W2 and the target width TW may be less than about 0.25 µm. The second pattern portion P2 may have the third width W3 in the row direction. Each of the second pattern portions P2 may have the third width W3 in the row direction. For example, the third width W3 may be more than about 5 µm and less than about 10 µm. The second pattern portion P2 may have a symmetrical shape with respect to the center of the gate line pattern GLPn.

In the present exemplary embodiment, the gate line pattern GLPn has a repeated structure in which the first pattern portion P1, the second pattern portion P2, and another second pattern portion P2 (e.g., another second pattern portion P2 having a width that may be different than that of the second pattern portion P2 but is less than the target width TW) are sequentially disposed. However, the present invention is not limited thereto. Alternatively, the gate line pattern GLPn may have a structure in which the first pattern portion P1 and the second pattern portion P2 are randomly disposed.

An exposure head of an exposure device outputs a plurality of beams. In addition, different beams may form a plurality of gate lines and a plurality of data lines of a display panel. Thus, a critical dimension of a line may be different from that of adjacent lines. Accordingly, defects, such as stain of display panel, may occur.

However, the pattern of the graphic data system file extending in the direction parallel to the scan direction of the exposure head according to the present exemplary embodiment has a structure in which the first pattern portion and the second pattern portion are alternately disposed. Thus, the pattern may have a sawtooth shape. Therefore, an effect resulting from different characteristics of various beams may be reduced such that defects, such as stain of display panel, may be reduced.

Figure 9:
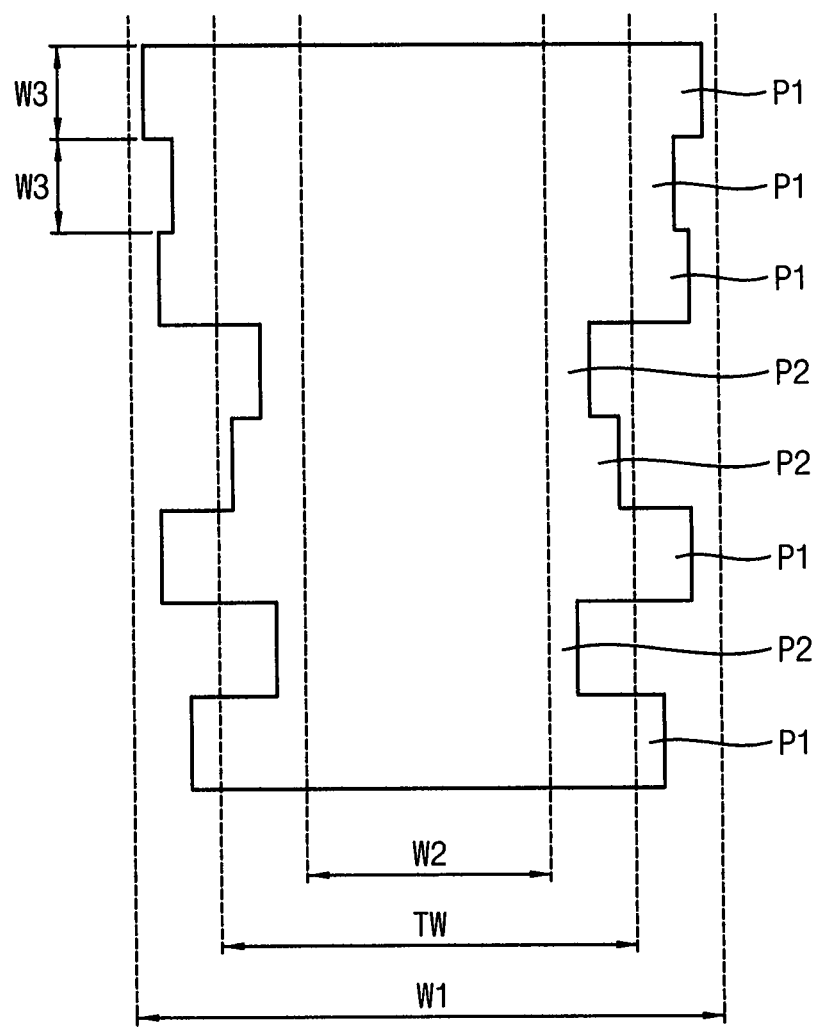
FIG. 9 is a magnified plan view of a gate pattern of a graphic data system file used for a digital micro-mirror device of an exposure head according to an exemplary embodiment of the present invention.

FIG. 9 is a magnified plan view of a gate pattern of a graphic data system file used for a digital micro-mirror device of an exposure head according to an exemplary embodiment of the present invention.

Referring to FIG. 9, the gate line pattern GLPn may include a first pattern portion P1 and a second pattern portion P2. The first pattern portion P1 may be alternately disposed with the second pattern portion P2.

The first pattern portion P1 may have a first width W1 in a column direction. The first width W1 may be greater than a target width TW in the column direction. For example, a difference between the first width W1 and the target width TW may be less than about 0.25 μm. The first pattern portion P1 may have a third width W3 in a row direction. Each of the first pattern portions P1 may have the third width W3 in the row direction. For example, the third width W3 may be more than about 5 μm and less than about 10 μm. The first pattern portion P1 may have a symmetrical shape with respect to a center of the gate line pattern GLPn.

The second pattern portion P2 may have a second width W2 in a column direction. The second width W2 may be less than the target width TW in the column direction. For example, a difference between the second width W2 and the target width TW may be less than about 0.25 μm. The second pattern portion P2 may have the third width W3 in the row direction. Each of the second pattern portions P2 may have the third width W3 in the row direction. For example, the third width W3 may be more than about 5 μm and less than about 10 μm. The second pattern portion P2 may have a symmetrical shape with respect to the center of the gate line pattern GLPn.

In the present exemplary embodiment, the gate line pattern GLPn has a structure in which the first pattern portion P1 and the second pattern portion P2 are randomly disposed. However, the present invention is not limited thereto. Alternatively, the gate line pattern GLPn may have a structure in which the first pattern portion P1 and the second pattern portion P2 are regularly disposed (e.g., are disposed in a set pattern).

An exposure head of an exposure device outputs a plurality of beams. In addition, different beams may form a plurality of gate lines and a plurality of data lines of a display panel. Thus, a critical dimension of one line may be different from that of adjacent lines. Accordingly, defects, such as stain of display panel, may occur.

However, the pattern of the graphic data system file extending in the direction parallel to the scan direction of the exposure head according to the present exemplary embodiment has a structure in which the first pattern portion and the second pattern portion are alternately disposed. Thus, the pattern may have a sawtooth shape. Therefore, an effect resulting from different characteristics of various beams may be reduced such that defects, such as stain of display panel, may be reduced.

Figure 10:
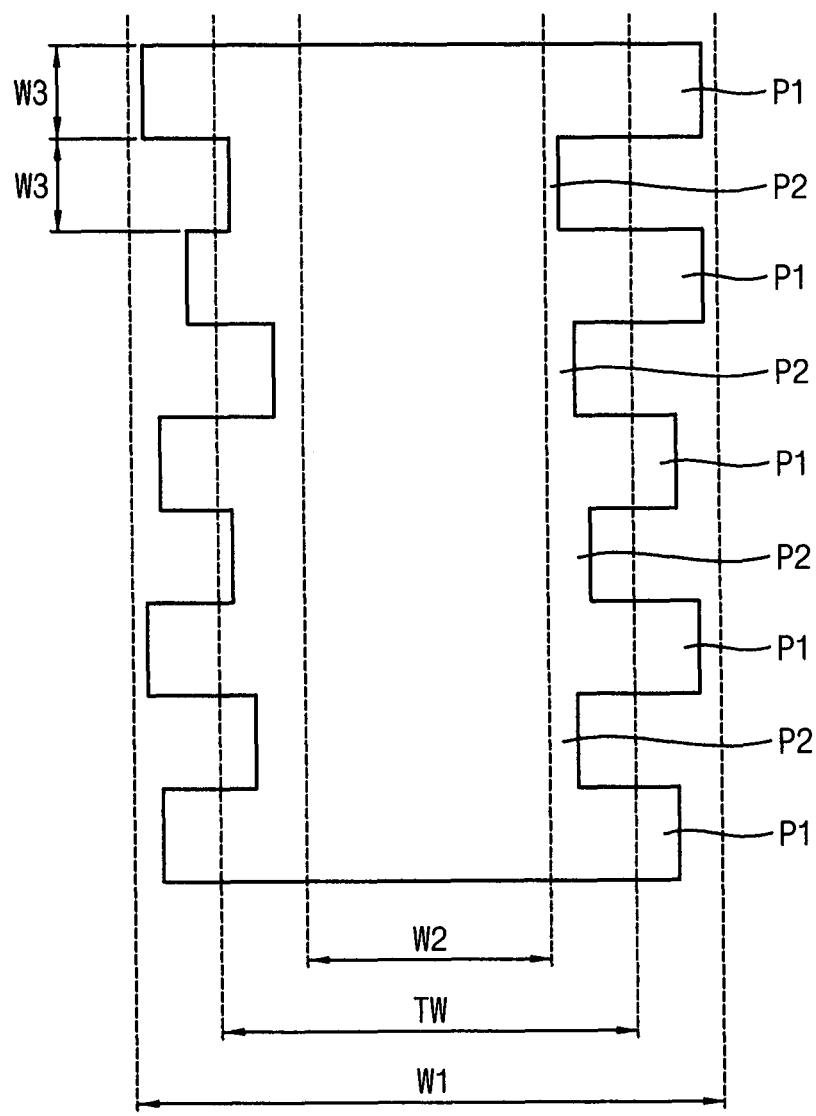
FIG. 10 is a magnified plan view of a gate pattern of a graphic data system file used for a digital micro-mirror device of an exposure head according to an exemplary embodiment of the present invention.

FIG. 10 is a magnified plan view of a gate pattern of a graphic data system file used for a digital micro-mirror device of an exposure head according to an exemplary embodiment of the present invention.

Referring to FIG. 10, the gate line pattern GLPn may include a first pattern portion P1 and a second pattern portion P2. The first pattern portion P1 may be alternately disposed with the second pattern portion P2.

The first pattern portion P1 may have a first width W1 in a column direction. The first width W1 may be greater than a target width TW in the column direction. For example, a difference between the first width W1 and the target width TW may be less than about 0.25 μm. The first pattern portion P1 may have a third width W3 in a row direction. Each of the first pattern portions P1 may have the third width W3 in the row direction. For example, the third width W3 may be more than about 5 μm and less than about 10 μm. The first pattern portion P1 may have an asymmetrical shape with respect to a center of the gate line pattern GLPn.

The second pattern portion P2 may have a second width W2 in the column direction. The second width W2 may be less than the target width TW in the column direction. For example, a difference between the second width W2 and the target width TW may be less than about 0.25 μm. The second pattern portion P2 may have the third width W3 in the row direction. Each of the second pattern portions P2 may have the third width W3 in the row direction. For example, the third width W3 may be more than about 5 μm and less than about 10 μm. The second pattern portion P2 may have an asymmetrical shape with respect to the center of the gate line pattern GLPn.

In the present exemplary embodiment, the gate line pattern GLPn has a repeated structure in which the first pattern portion P1 and the second pattern portion P2 are sequentially disposed. However, the present invention is not limited thereto. Alternatively, the gate line pattern GLPn may have a structure in which the first pattern portion P1 and the second pattern portion P2 are randomly disposed.

An exposure head of an exposure device outputs a plurality of beams. In addition, different beams may form a plurality of gate lines and a plurality of data lines of a display panel. Thus, a critical dimension of one line may be different from that of adjacent lines. Accordingly, defects, such as stain of display panel, may occur.

However, the pattern of the graphic data system file extending in the direction parallel to the scan direction of the exposure head according to the present exemplary embodiment has a structure in which the first pattern portion and the second pattern portion are alternately disposed. Thus, the pattern may have a sawtooth shape. Therefore, an effect resulting from different characteristics of various beams may be offset such that defects, such as stain of display panel, may be reduced.

Figure 11:
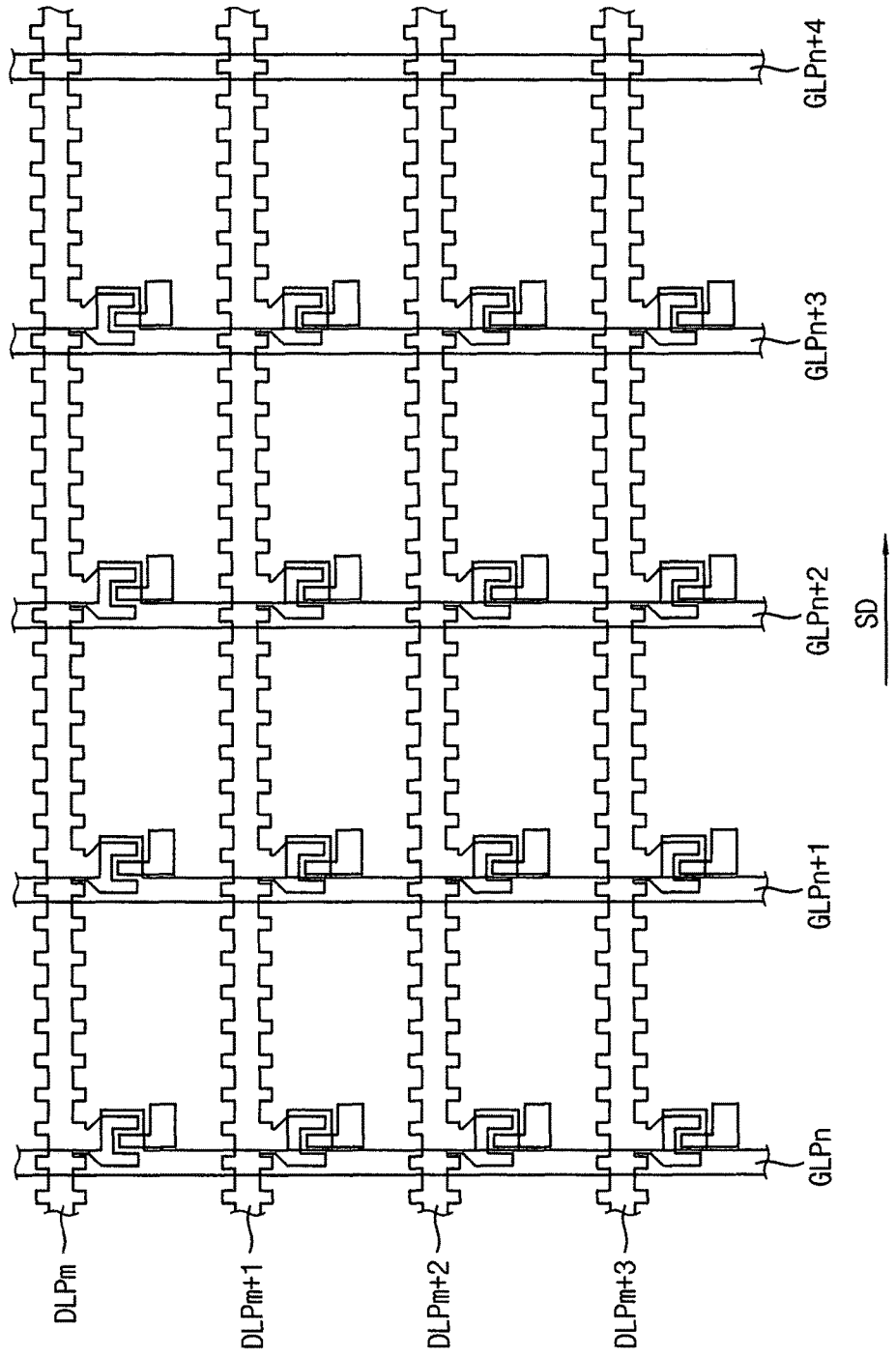
FIG. 11 is a plan view illustrating a gate pattern and a data pattern of a graphic data system file used for a digital micro-mirror device of an exposure head according to an exemplary embodiment of the present invention.

FIG. 11 is a plan view illustrating a gate pattern and a data pattern of a graphic data system file used for a digital micro-mirror device of an exposure head according to an exemplary embodiment of the present invention.

Referring to FIG. 11, a gate pattern and a data pattern of a graphic data system file used for a digital micro-mirror device of an exposure head according to an exemplary embodiment of the present inventive concept is illustrated.

The GDS file includes data regarding a plurality of pixels arranged in a column direction and a row direction. A pattern of the GDS file extending in a direction parallel with a scan direction of the exposure head may have a sawtooth shape. In the present exemplary embodiment, the pattern extending in the direction parallel to the scan direction of the exposure head of the GDS file may be a data line pattern DLPm.

In the present exemplary embodiment, the data line pattern DLPm extends in the direction parallel to the scan direction SD. Thus, the data line pattern DLPm has a sawtooth shape. However, a gate line pattern GLPn extends in a direction crossing (e.g., perpendicular to) the scan direction SD. Thus, the gate line pattern GLPn does not have a sawtooth shape but has a straight-line shape.

However, the present invention is not limited thereto. Alternatively, when the gate line pattern GLPn extends in a direction parallel to the scan direction SD, the gate line pattern GLPn may have a sawtooth shape. In addition, all patterns extending in the direction parallel to the scan direction of the exposure head may have a sawtooth shape.

Figure 12:
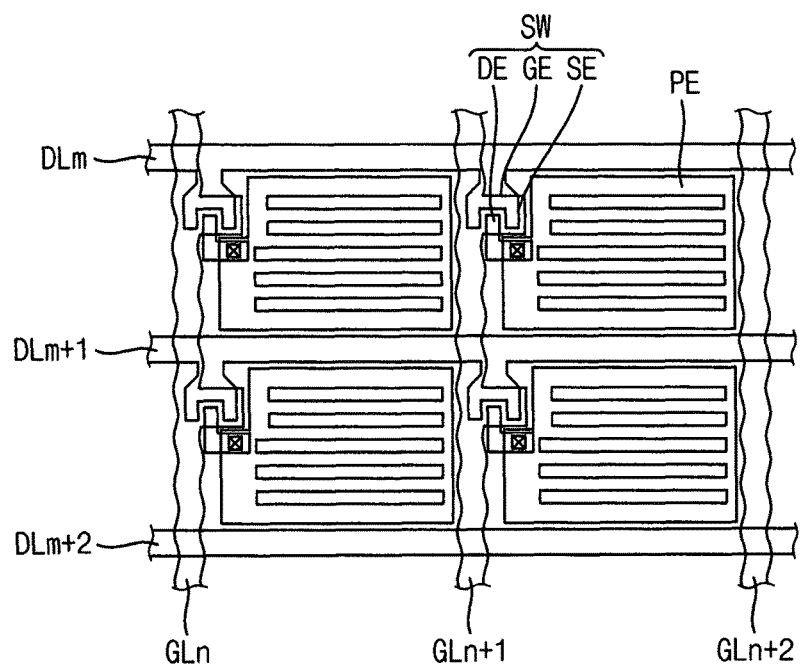
FIG. 12 is a plan view illustrating a display substrate manufactured by using a maskless exposure device according to an exemplary embodiment of the present invention.

FIG. 12 is a plan view illustrating a display substrate manufactured by using a maskless exposure device according to an exemplary embodiment of the present invention.

Referring to FIG. 12, a display substrate according to an exemplary embodiment of the present invention includes a gate line GLn, a data line DLm, a switching transistor SW including a gate electrode GE, a source electrode SE, and a drain electrode DE, and a pixel electrode PE.

The gate line GLn may have a single layer structure including copper (Cu), silver (Ag), chrome (Cr), molybdenum (Mo), aluminum (Al), titanium (Ti), manganese (Mn), or a mixture thereof. In addition, the gate line GLn may have a multi-layer structure having a plurality of layers including materials different each other. For example, the gate line GLn may include a copper layer and a titanium layer disposed on and/or under the copper layer.

The gate electrode GE is electrically coupled to (e.g., electrically connected to) the gate line GLn. The gate electrode GE may have a single layer structure including copper (Cu), silver (Ag), chrome (Cr), molybdenum (Mo), aluminum (Al), titanium (Ti), manganese (Mn), or a mixture thereof. In addition, the gate electrode GE may have a multi-layer structure having a plurality of layers including materials different each other. For example, the gate electrode GE may include a copper layer and a titanium layer disposed on and/or under the copper layer.

The data line DLm extends in a direction crossing (e.g., perpendicular to) the extending direction of the gate line GLn. The data line DLm may have a single layer structure including copper (Cu), silver (Ag), chrome (Cr), molybdenum (Mo), aluminum (Al), titanium (Ti), manganese (Mn), and/or a mixture thereof. In addition, the data line DLm may have a multi-layer structure having a plurality of layers including materials different each other. For example, the data line DLm may include a copper layer and a titanium layer disposed on and/or under the copper layer. The data line DLm may have a thickness of about 6000 Å.

The source electrode SE and the drain electrode DE may be spaced apart from each other. The source electrode SE and the drain electrode DE may be formed on the same layer as the data line DL.

The source electrode SE and the drain electrode DE may have a single layer structure including copper (Cu), silver (Ag), chrome (Cr), molybdenum (Mo), aluminum (Al), titanium (Ti), manganese (Mn), and/or a mixture thereof. In addition, the source electrode SE and the drain electrode DE may have a multi-layer structure having a plurality of layers including materials different each other. For example, the source electrode SE and the drain electrode DE may each include a copper layer and a titanium layer disposed on and/or under the copper layer.

The pixel electrode PE may include a transparent conductive material, such as indium tin oxide (ITO) and/or indium zinc oxide (IZO). In addition, the pixel electrode PE may include titanium (Ti) and/or molybdenum titanium (MoTi). The pixel electrode PE may be electrically coupled to the drain electrode DE.

In the present exemplary embodiment, the gate line GLn extends in a direction parallel to the scan direction. Sides of the gate line GLn are non-uniform in a plan view. However, the data line DLm extends in a direction crossing the scan direction. Thus, the data line DLm has a straight-line shape.

An exposure head of an exposure device outputs a plurality of beams. In addition, different beams may form a plurality of gate lines and a plurality of data lines of a display panel. Thus, a critical dimension of one line may be different from that of adjacent lines. Accordingly, defects, such as stain of display panel, may occur.

However, sides of the gate line GLn according to the present exemplary embodiment are non-uniform in a plan view. Therefore, an effect resulting from different characteristics of various beams may be offset, and a difference of critical dimension of adjacent lines may be reduced. Accordingly, defects, such as stain of display panel, may be reduced.

Figure 13:
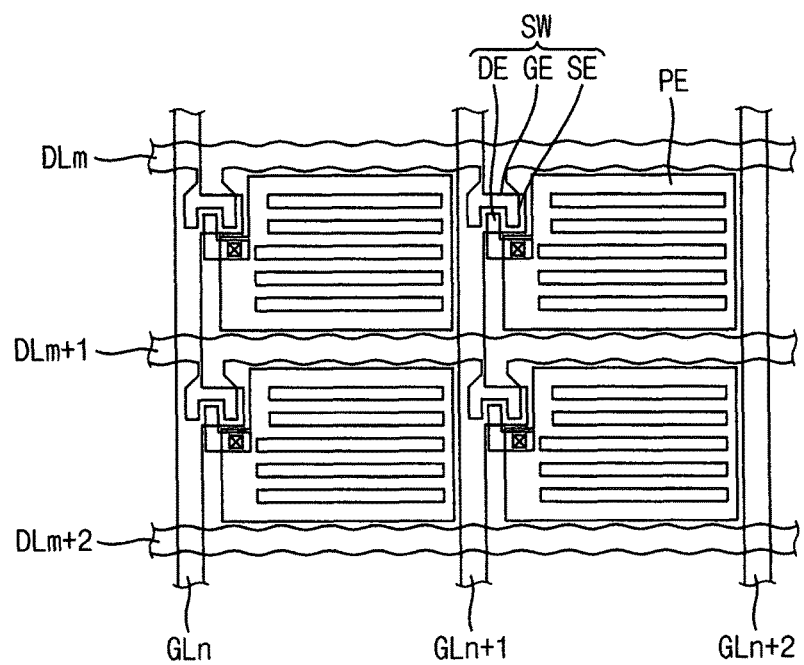
FIG. 13 is a plan view illustrating a display substrate manufactured by using a maskless exposure device according to an exemplary embodiment of the present invention.

FIG. 13 is a plan view illustrating a display substrate manufactured by using a maskless exposure device according to an exemplary embodiment of the present invention.

Referring to FIG. 13, a display substrate according to an exemplary embodiment of the present invention includes a gate line GLn, a data line DLm, a gate electrode GE, a source electrode SE, a drain electrode DE, and a pixel electrode PE.

The gate line GLn may have a single layer structure including copper (Cu), silver (Ag), chrome (Cr), molybdenum (Mo), aluminum (Al), titanium (Ti), manganese (Mn), and/or a mixture thereof. In addition, the gate line GLn may have a multi-layer structure having a plurality of layers including materials different each other. For example, the gate line GLn may include a copper layer and a titanium layer disposed on and/or under the copper layer.

The gate electrode GE is electrically coupled to the gate line GLn. The gate electrode GE may have a single layer structure including copper (Cu), silver (Ag), chrome (Cr), molybdenum (Mo), aluminum (Al), titanium (Ti), manganese (Mn), and/or a mixture thereof. In addition, the gate electrode GE may have a multi-layer structure having a plurality of layers including materials different each other. For example, the gate electrode GE may include a copper layer and a titanium layer disposed on and/or under the copper layer.

The data line DLm extends in a direction crossing the extending direction of the gate line GLn. The data line DLm may have a single layer structure including copper (Cu), silver (Ag), chrome (Cr), molybdenum (Mo), aluminum (Al), titanium (Ti), manganese (Mn), and/or a mixture thereof. In addition, the data line DLm may have a multi-layer structure having a plurality of layers including materials different each other. For example, the data line DLm may include a copper layer and a titanium layer disposed on and/or under the copper layer. The data line DLm may have a thickness of about 6000 Å.

The source electrode SE and the drain electrode DE may be spaced apart from each other. The source electrode SE and the drain electrode DE may be formed of the same layer as the data line DL.

The source electrode SE and the drain electrode DE may each have a single layer structure including copper (Cu), silver (Ag), chrome (Cr), molybdenum (Mo), aluminum (Al), titanium (Ti), manganese (Mn), and/or a mixture thereof. In addition, the source electrode SE and the drain electrode DE may each have a multi-layer structure having a plurality of layers including materials different each other. For example, the source electrode SE and the drain electrode DE may each include a copper layer and a titanium layer disposed on and/or under the copper layer.

The pixel electrode PE may include a transparent conductive material, such as indium tin oxide (ITO) and/or indium zinc oxide (IZO). In addition, the pixel electrode PE may include titanium (Ti) and/or molybdenum titanium (MoTi). The pixel electrode PE may be electrically coupled to the drain electrode DE.

In the present exemplary embodiment, the data line DLm extends in a direction parallel to the scan direction. Sides of the data line DLm are non-uniform in a plan view. However, the gate line GLn extends in a direction crossing the scan direction. Thus, the gate line GLn has a straight-line shape.

An exposure head of an exposure device outputs a plurality of beams. In addition, different beams may form a plurality of gate lines and a plurality of data lines of a display panel. Thus, a critical dimension of one line may be different from that of adjacent lines. Accordingly, defects, such as stain of display panel, may occur.

However, sides of the gate line GLn according to the present exemplary embodiment are non-uniform in a plan view. Therefore, an effect resulting from different characteristics of various beams may be offset, and a difference of critical dimension of adjacent lines may be reduced. Accordingly, defects, such as stain of display panel, may be reduced.

According to the present exemplary embodiment, the pattern of the graphic data system file extending in the direction parallel to the scan direction of the exposure head according to the present exemplary embodiment has a structure in which the first pattern portion and the second pattern portion are alternately disposed. Thus, the pattern may have a sawtooth shape. Therefore, an effect resulting from different characteristics of various beams may be offset such that defects, such as stain of display panel, may be reduced.

In addition, sides a gate line or a data line of a display panel are non-uniform in a plan view. Therefore, an effect resulting from different characteristics of different beams may be offset, and a difference of critical dimension of adjacent lines may be reduced. Accordingly, defects, such as stain of display panel, may be reduced.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the aspects and characteristics of the present invention. Accordingly, all such modifications are intended to be included within the scope of the present invention as defined by the claims and their equivalents. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims and their equivalents. The present inventive concept is defined by the following claims, with equivalents of the claims to be included therein.

What is claimed is:

1. A maskless exposure device comprising:
    an exposure head comprising a digital micro-mirror device and an exposure source, the digital micro-mirror device being configured to reflect a source beam output from the exposure source to a substrate; and
    a system controller configured to control the digital micro-mirror device by using a graphic data system file,
    wherein the graphic data system file comprises data regarding patterns to be formed on the substrate, and
    wherein at least one of the patterns extending in a direction parallel to a scan direction of the exposure head comprises:
        a first pattern portion having a first width that is greater than a target width; and
        a second pattern portion alternately arranged with the first pattern portion and having a second width that is less than the target width.

2. The maskless exposure device of claim 1, wherein a difference between the first width and the target width is less than about 0.25 μm, and a difference between the second width and the target width is less than about 0.25 μm.

3. The maskless exposure device of claim 2, wherein the pattern extending in the direction parallel to the scan direction of the exposure head has a structure in which the first pattern portion and the second pattern portion are sequentially arranged, and wherein the structure repeats.

4. The maskless exposure device of claim 2, wherein the pattern extending in the direction parallel to the scan direction of the exposure head has a structure in which the first pattern portion, another first pattern portion, and the second pattern portion are sequentially arranged, and wherein the structure repeats.

5. The maskless exposure device of claim 2, wherein the pattern extending in the direction parallel to the scan direction of the exposure head has a structure in which the first pattern portion, the second pattern portion, and another second pattern portion are sequentially arranged, and wherein the structure repeats.

6. The maskless exposure device of claim 1, wherein the first width of the first pattern portion is greater than about 5 μm and less than about 10 μm.

7. The maskless exposure device of claim 1, wherein the second width of the second pattern portion is greater than about 5 μm and less than about 10 μm.

8. The maskless exposure device of claim 1, wherein the pattern extending in the direction parallel to the scan direction of the exposure head is a pattern configured to form a gate line.

9. The maskless exposure device of claim 1, wherein the pattern extending in the direction parallel to the scan direction of the exposure head is a pattern configured to form a data line.

10. A method of maskless exposure, the method comprising:
    generating digital micro-mirror device on/off data from a graphic data system file corresponding to a pattern to be formed on a substrate; and
    exposing the substrate in response to the digital micro-mirror device on/off data,
    wherein the graphic data system file comprises data regarding patterns to be formed on the substrate, and
    wherein one of the patterns extending in a direction parallel to a scan direction of an exposure head comprises:
        a first pattern portion having a first width that is greater than a target width; and
        a second pattern portion alternately arranged with the first pattern portion and having a second width that is less than the target width.

11. The method of claim 10, wherein a difference between the first width and the target width is less than about 0.25 μm, and a difference between the second width and the target width is less than about 0.25 μm.

12. The method of claim 11, wherein the pattern extending in the direction parallel to the scan direction of the exposure head has a structure in which the first pattern portion and the second pattern portion are sequentially arranged, and wherein the structure repeats.

13. The method of claim 11, wherein the pattern extending in the direction parallel to the scan direction of the exposure head has a structure in which the first pattern portion, another first pattern portion, and the second pattern portion are sequentially arranged, and wherein the structure repeats.

14. The method of claim 11, wherein the pattern extending in the direction parallel to the scan direction of the exposure head has a structure in which the first pattern portion, the second pattern portion, and another second pattern portion are sequentially arranged, and wherein the structure repeats.

15. The method of claim 10, wherein the first width of the first pattern portion is greater than about 5 μm and less than about 10 μm.

16. The method of claim 10, wherein the second width of the second pattern portion is greater than about 5 μm and less than about 10 μm.

17. The method of claim 10, wherein the pattern extending in the direction parallel to the scan direction of the exposure head is a pattern configured to form a gate line.

18. The method of claim 10, wherein the pattern extending in the direction parallel to the scan direction of the exposure head is a pattern configured to form a data line.

* * * * *